(12) United States Patent
Nishita et al.

(10) Patent No.: US 10,795,261 B2
(45) Date of Patent: Oct. 6, 2020

(54) ADDITIVE FOR RESIST UNDERLAYER FILM-FORMING COMPOSITION AND RESIST UNDERLAYER FILM-FORMING COMPOSITION CONTAINING THE SAME

(71) Applicant: NISSAN CHEMICAL INDUSTRIES, LTD., Tokyo (JP)

(72) Inventors: Tokio Nishita, Toyama (JP); Rikimaru Sakamoto, Toyama (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 173 days.

(21) Appl. No.: 15/774,321

(22) PCT Filed: Nov. 8, 2016

(86) PCT No.: PCT/JP2016/083116
§ 371 (c)(1),
(2) Date: May 8, 2018

(87) PCT Pub. No.: WO2017/086213
PCT Pub. Date: May 26, 2017

(65) Prior Publication Data
US 2019/0317405 A1  Oct. 17, 2019

(30) Foreign Application Priority Data
Nov. 17, 2015 (JP) ................. 2015-225048

(51) Int. Cl.
*G03F 7/11*     (2006.01)
*C08F 220/36*   (2006.01)
(Continued)

(52) U.S. Cl.
CPC ............. *G03F 7/11* (2013.01); *C08F 220/36* (2013.01); *G03F 7/38* (2013.01); *G03F 7/162* (2013.01);
(Continued)

(58) Field of Classification Search
CPC ........ C08F 20/36; C08F 20/58; C08F 220/18; C08F 220/22; C08F 220/24; C08F 220/30;
(Continued)

(56) References Cited

U.S. PATENT DOCUMENTS

2011/0091812 A1* 4/2011 Hatakeyama ......... G03F 7/0045
                                                 430/284.1
2015/0086929 A1* 3/2015 Hatakeyama ............. G03F 7/40
                                                 430/324

(Continued)

FOREIGN PATENT DOCUMENTS

JP   2010-237491 A   10/2010
JP   2011-102974 A    5/2011
(Continued)

OTHER PUBLICATIONS

English Translation of text of WO-2011/065207 A1. from WIPO IP Portal generated by machine on Jan. 2, 2020, 32 pages (Year: 2020).*

(Continued)

*Primary Examiner* — Cynthia Hamilton
(74) *Attorney, Agent, or Firm* — Oliff PLC

(57) ABSTRACT

An additive for a resist underlayer film-forming composition, including a copolymer having structural units of the following Formulae (1) to (3):

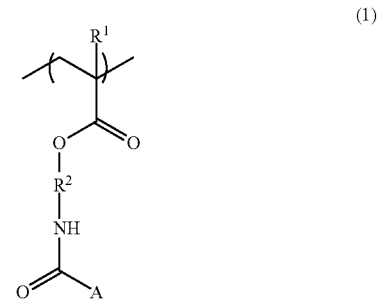

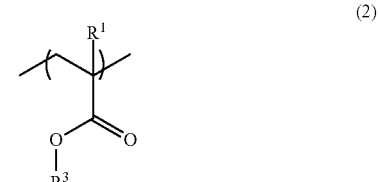

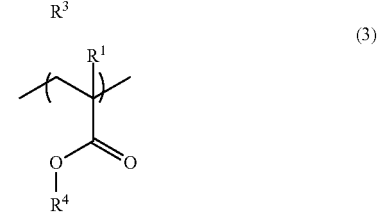

wherein $R^1$s are each independently a hydrogen atom or a methyl group, $R^2$ is a $C_{1-3}$ alkylene group, A is a protecting group, $R^3$ is an organic group having 4 to 7-membered ring lactone skeleton, adamantane skeleton, tricyclodecane skeleton, or norbornane skeleton, and $R^4$ is a linear, branched, or cyclic organic group having a carbon atom number of 1 to 12, wherein at least one hydrogen atom is substituted with a fluoro group and that optionally has at least one hydroxy group as a substituent. A resist underlayer film-forming composition for lithography including additive, a resin that is different from copolymer, organic acid, crosslinker, and solvent, wherein the copolymer's content is 3 parts by mass to 40 parts by mass relative to 100 parts by mass of the resin.

7 Claims, No Drawings

(51) Int. Cl.
  *G03F 7/38* (2006.01)
  *G03F 7/16* (2006.01)
  *G03F 7/20* (2006.01)
  *G03F 7/32* (2006.01)

(52) U.S. Cl.
  CPC ............ *G03F 7/168* (2013.01); *G03F 7/2004* (2013.01); *G03F 7/2006* (2013.01); *G03F 7/322* (2013.01)

(58) Field of Classification Search
  CPC ... C08F 220/36; C09D 133/14; C09D 133/26; G03F 7/094; G03F 7/11
  See application file for complete search history.

(56) References Cited

U.S. PATENT DOCUMENTS

2017/0045818 A1* 2/2017 Karasawa ................. G03F 7/26
2019/0227438 A1* 7/2019 Nishita .................... G03F 7/168

FOREIGN PATENT DOCUMENTS

| | | |
|---|---|---|
| JP | 2012-078815 A | 4/2012 |
| JP | 2015-087749 A | 5/2015 |
| WO | 03/017002 A1 | 3/2003 |
| WO | 2010/074075 A1 | 7/2010 |
| WO | 2011/065207 A1 | 6/2011 |
| WO | 2013/058189 A1 | 4/2013 |
| WO | 2015/012172 A1 | 1/2015 |
| WO | 2015/146443 A1 | 10/2015 |
| WO | WO-2015178235 A1 * 11/2015 ............ G03F 7/094 |
| WO | 2017/086213 A1 | 5/2017 |

OTHER PUBLICATIONS

English translation of Description of (application JP 2011-193623 which published as JP 2012-078815 A downloaded Jan. 3, 2020 from Global DOssier website 105 pages (Year: 2020).*
Feb. 7, 2017 Written Opinion of the International Searching Authority issued in Internatioal Patent Application No. PCT/JP2016/083116.
Feb. 7, 2017 International Search Report issued in International Patent Application No. PCT/JP2016/083116.
Nov. 21, 2017 Search Report issued in International Patent Application No. PCT/JP2017/033521.
Nov. 21, 2017 Written Opinion issued in International Patent Application No. PCT/JP2017/033521.
U.S. Appl. No. 16/332,219, filed Mar. 11, 2019 in the name of Tokio Nishita et al.

* cited by examiner

ADDITIVE FOR RESIST UNDERLAYER FILM-FORMING COMPOSITION AND RESIST UNDERLAYER FILM-FORMING COMPOSITION CONTAINING THE SAME

TECHNICAL FIELD

The present invention relates to an additive to be added to a resist underlayer film-forming composition, and in particular, relates to an additive for enhancing the adhesion of a resist underlayer film to a resist pattern. The present invention further relates to a resist underlayer film-forming composition for lithography containing the additive, and in particular, relates to a resist underlayer film-forming composition for lithography having excellent application property to a substrate even in formation of a resist underlayer film having small thickness (for example, 25 nm or less).

BACKGROUND ART

In ArF immersion lithography and extreme ultraviolet light (EUV) lithography, miniaturization of processing dimension of a resist pattern line width has been required. In formation of finer resist pattern described above, a contact area between a resist pattern and an underlying substrate decreases to increase an aspect ratio of the resist pattern (height of the resist pattern/line width of the resist pattern). Thus, there is a concern that the resist pattern is likely to collapse. Therefore, in a resist underlayer film or an anti-reflective coating that comes into contact with the resist pattern, high adhesion to the resist pattern has been required for prevention of collapse of the resist pattern.

It is reported that a resist underlayer film-forming composition containing a lactone structure is used in order to exhibit high adhesion to a resist pattern, which enhances adhesion to the resist pattern obtained (Patent Document 1). That is, when a resist underlayer film-forming composition containing a polar moiety like a lactone structure is used, the adhesion to the resist pattern is enhanced. Accordingly, prevention of collapse of the resist pattern is expected for the finer resist pattern.

However, in a lithography process that requires formation of a finer resist pattern, such as ArF immersion lithography and extreme ultraviolet light (EUV) lithography, only a lactone structure contained in the resist underlayer film-forming composition cannot sufficiently prevent the collapse of the resist pattern.

In order to achieve high adhesion of a resist underlayer film to a resist pattern, Patent Document 2 describes an additive for a resist underlayer film-forming composition that can modify a surface state of the resist underlayer film into a basic state to suppress change of skirt shape of the resist pattern into an undercut shape. Patent Document 3 describes an additive for a resist underlayer film-forming composition that can segregate an additive component near a surface of a resist underlayer film to suppress change of skirt shape of a resist pattern into a footing shape.

Patent Document 4 describes an additive for a resist underlayer film-forming composition that can modify a surface state of a resist underlayer film into a hydrophobic state and decrease the Laplace force during development of a resist pattern and rinsing with pure water, to improve the adhesion of the resist pattern to the resist underlayer film. Patent Document 5 describes an additive for a resist underlayer film-forming composition that can modify the acidity near a surface of a resist underlayer film to form a cross-sectional shape of a resist pattern into a straight shape and improve the adhesion of the resist pattern to the resist underlayer film, in a resist pattern forming process. In the resist pattern forming process, an unexposed area of a resist film is removed by using a solvent capable of dissolving the resist film, and an exposed area of the resist film is left as the resist pattern.

Patent Document 6 describes a resist underlayer film-forming composition for lithography containing a copolymer having a structural unit in which a sulfo group is introduced into a terminal, a crosslinker, and a solvent. The invention described in Patent Document 6 exerts an effect of suppressing the generation of a sublimate derived from a cross-linking catalyst component in formation of a resist underlayer film, and can provide the resist underlayer film capable of forming a resist pattern of favorable shape in which the lower portion does not almost have a footing shape.

PRIOR ART DOCUMENTS

Patent Documents

Patent Document 1: International Publication WO03/017002
Patent Document 2: International Publication WO2013/058189
Patent Document 3: International Publication WO2010/074075
Patent Document 4: International Publication WO2015/012172
Patent Document 5: International Publication WO2015/146443
Patent Document 6: Japanese Patent Application Publication No. 2010-237491 (JP 2010-237491 A)

SUMMARY OF THE INVENTION

Problem to be Solved by the Invention

In recent years, miniaturization of a resist pattern has increasingly advanced. In order to prevent pattern collapse with the miniaturization of the resist pattern, attention is focused on an interaction between a resist underlayer film and the resist pattern, and various investigations are made. In particular, enhancement in adhesion of the resist underlayer film to the resist pattern by a chemical bond between a component of a resist material and a surface of the resist underlayer film is expected. It is an object of the present invention to provide an additive for a resist underlayer film-forming composition in order to improve the adhesion of the resist underlayer film to the resist pattern, which additive modifies a surface of a resist underlayer film to be formed from the resist underlayer film-forming composition into a surface state to cross-link with the component of the resist material by being added to the resist underlayer film-forming composition. Modifying the surface of the resist underlayer film into the surface state to cross-link with the component of the resist material means that the resist underlayer film-forming composition containing the additive is applied to a substrate and baked to form the resist underlayer film, and at the same time, the additive is transferred to the surface of the resist underlayer film.

Means for Solving the Problems

A first aspect of the present invention is an additive for a resist underlayer film-forming composition, comprising a copolymer having structural units of the following Formulae (1) to (3):

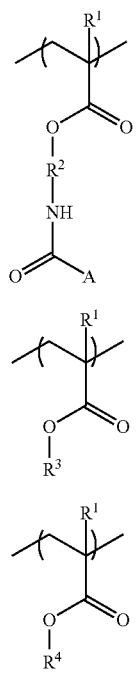

(1)

(2)

(3)

(wherein R's are each independently a hydrogen atom or a methyl group, $R^2$ is a $C_{1-3}$ alkylene group, A is a protecting group, $R^3$ is an organic group having 4 to 7-membered ring lactone skeleton, adamantane skeleton, tricyclodecane skeleton, or norbornane skeleton, and $R^4$ is a linear, branched, or cyclic organic group having a carbon atom number of 1 to 12, in which at least one hydrogen atom is substituted with a fluoro group and that optionally has at least one hydroxy group as a substituent).

The copolymer may further have a structural unit of the following Formula (4):

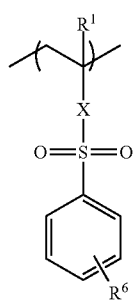

(4)

(wherein $R^1$ has the same definition as $R^1$ in Formulae (1), (2), and (3), X is a direct bond or a —C(=O)O—$R^5$— group, $R^5$ constituting the —C(=O)O—$R^5$— group is a $C_{1-3}$ alkylene group, which is bonded to a sulfur atom, and $R^6$ is a hydrogen atom, a methyl group, a methoxy group, or a halogeno group).

The structural unit of Formula (4) is, for example, a structural unit of the following Formula (4a) or (4b):

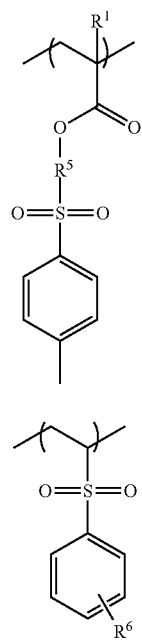

(4a)

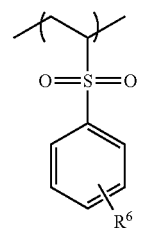

(4b)

(wherein $R^1$, $R^5$, and $R^6$ have the same definitions as $R^1$, $R^5$, and $R^6$ in Formula (4)).

The structural unit of Formula (1) is, for example, a structural unit of the following Formula (1a), (1b), (1c), or (1d):

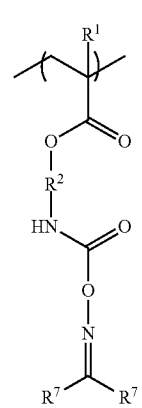

(1a)

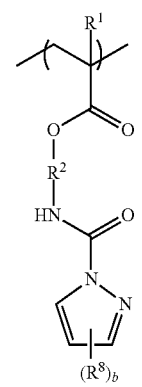

(1b)

-continued (1c)

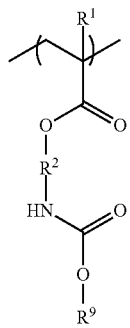

(1d)

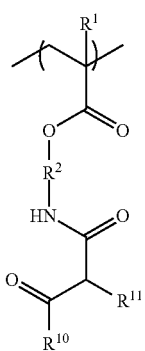

(wherein $R^1$ and $R^2$ have the same definitions as $R^1$ and $R^2$ in Formula (1), each of two R's is independently a hydrogen atom, a methyl group, or ethyl group, $R^8$ is a methyl group, b is an integer of 0 to 3, $R^9$ is a linear or branched alkyl group having a carbon atom number of 1 to 6, or a linear or branched alkoxyalkyl group having a carbon atom number of 1 to 6, $R^{10}$ is a linear or branched alkoxy group having a carbon atom number of 1 to 6, and $R^{10}$ is a hydrogen atom, or a linear or branched alkoxycarbonyl group having a carbon atom number of 2 to 6).

The copolymer may have a structural unit of the following Formula (5), instead of the structural unit of Formula (2).

(5)

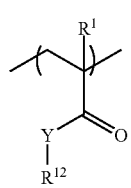

(wherein $R^1$ has the same definition as R in Formulae (1), (2), and (3), Y is an —O— group or an —NH— group, and $R^{12}$ is a linear or branched hydroxyalkyl group having a carbon atom number of 1 to 12, in which at least one hydrogen atom is optionally substituted with a fluoro group or a chloro group and that optionally has a phenoxy group as a substituent.)

For example, the copolymer has a weight average molecular weight of 1,500 to 20,000, and preferably 3,000 to 15,000. When the weight average molecular weight is less than 1,500, the solvent resistance of a resist underlayer film to be formed from a resist underlayer film-forming composition containing the copolymer as the additive is not obtained. In contrast, when the weight average molecular weight is more than 20,000, the solubility of the copolymer in a solvent during preparation of the resist underlayer film-forming composition may be deteriorated.

A second aspect of the present invention is a resist underlayer film-forming composition for lithography comprising the additive for a resist underlayer film-forming composition, a resin having structural units of the following Formulae (6) and (7) that is different from the copolymer used for the additive, an organic acid, a crosslinker, and a solvent. The content of the copolymer used for the additive is 3 parts by mass to 40 parts by mass relative to 100 parts by mass of the resin.

(6)

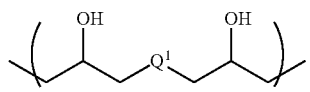

(7)

(wherein $Q^1$ and $Q^2$ are each independently a divalent organic group having a linear or branched hydrocarbon group having a carbon atom number of 1 to 13, a divalent organic group having an alicyclic hydrocarbon ring, a divalent organic group having an aromatic hydrocarbon ring, or a divalent organic group having a heterocyclic ring containing 1 to 3 nitrogen atoms, and the hydrocarbon group, the alicyclic hydrocarbon ring, the aromatic hydrocarbon ring, and the heterocyclic ring optionally have at least one substituent.)

The copolymer used for the additive for a resist underlayer film-forming composition is preferably contained in an amount of 5 parts by mass to 30 parts by mass relative to 100 parts by mass of the resin. When the amount of the copolymer to be added is less than 3 parts by mass, the adhesion to a resist pattern cannot be expressed. In contrast, when the amount of the copolymer to be added is more than 40 parts by mass, the solvent resistance after curing the resist underlayer film is not obtained.

A third aspect of the present invention is a method for forming a resist pattern comprising the steps of: applying the resist underlayer film-forming composition for lithography to a substrate, followed by baking, to form a resist underlayer film having a thickness of 1 nm to 25 nm; applying a resist solution to the resist underlayer film, followed by heating, to form a resist film; exposing the resist film with a photomask to radiation selected from the group consisting of a KrF excimer laser, an ArF excimer laser, and extreme ultraviolet light; and developing the exposed resist film by using a developer.

Effects of the Invention

When a resist underlayer film-forming composition in which the additive according to the present invention is added is applied to a lithography process, the additive is transferred to a surface of a resist underlayer film. At that time, an isocyanate group that is derived from a structural unit of Formula (1) of a copolymer used for the additive and that is blocked with a protecting group is present on the surface of the resist underlayer film. During heating in formation of a resist film on the resist underlayer film, the protecting group is deprotected to produce an isocyanate group (—N═C═O), and the isocyanate group is chemically bonded to a component of a resist material. Therefore, the adhesion of the resist underlayer film to a resist pattern can be improved, and as a result, collapse of the resist pattern can be prevented. The additive according to the present invention can be also used in a process that requires use of an ultra-thin resist underlayer film, such as an EUV lithography process, in which the additive is added to a resist underlayer film-forming composition that can be applied in an extremely thin film shape.

MODES FOR CARRYING OUT THE INVENTION

[Copolymer]

The copolymer used for the additive for a resist underlayer film-forming composition according to the first aspect of the present invention is a copolymer having structural units of Formulae (1) to (3), a copolymer having a structural unit of Formula (4) in addition to the structural units of Formulae (1) to (3), or a copolymer that is the same copolymer as described above except that a structural unit of Formula (5) is contained instead of the structural unit of Formula (2).

The structural unit of Formula (1) has an isocyanate group blocked with a protecting group. The protecting group is deprotected by heating, to produce an isocyanate group. Examples of the structural unit of Formula (1) include structural units of the following Formulae (1-1) to (1-20).

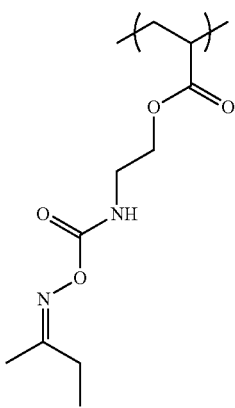

(1-1)

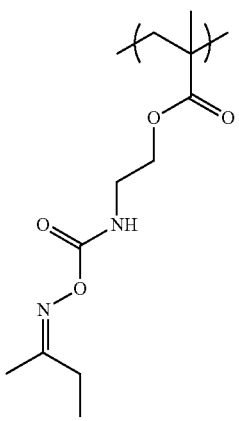

(1-2)

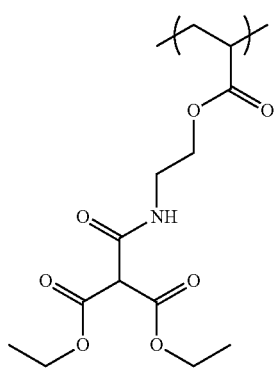

(1-3)

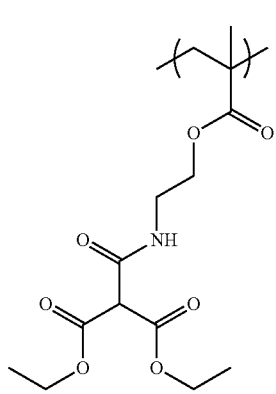

(1-4)

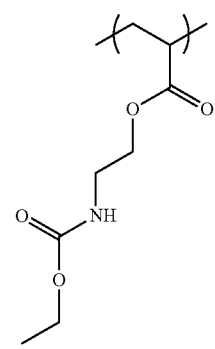

(1-5)

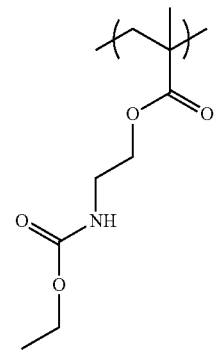

(1-6)

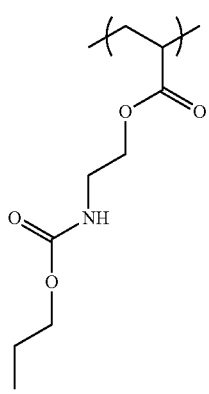
(1-7)
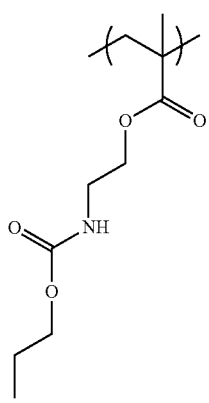
(1-8)
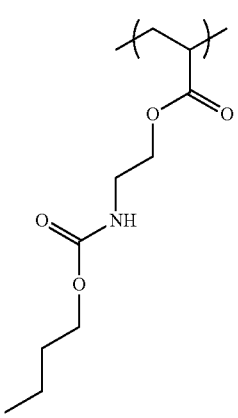
(1-9)
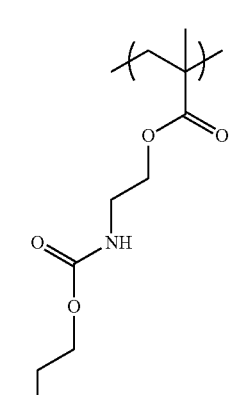
(1-10)
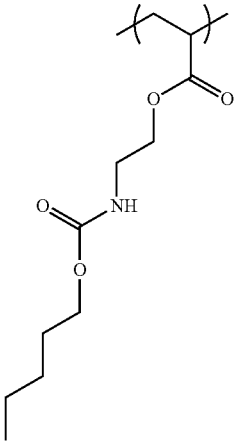
(1-11)
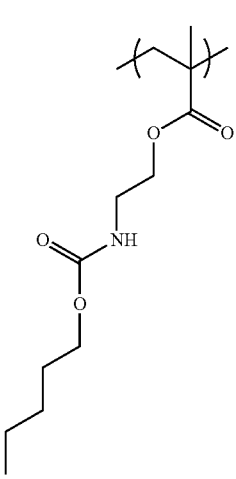
(1-12)
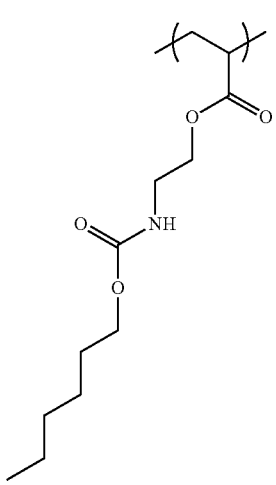
(1-13)

(1-14)
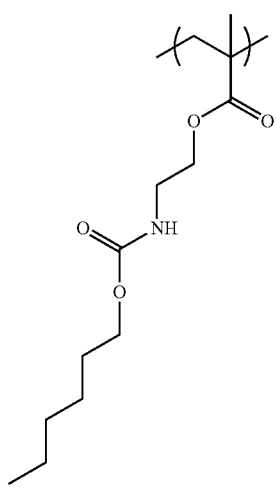
(1-15)
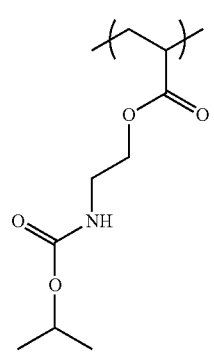
(1-16)
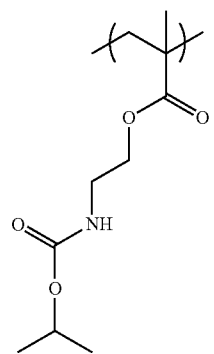
(1-17)
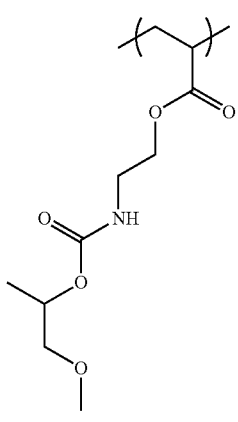
(1-18)
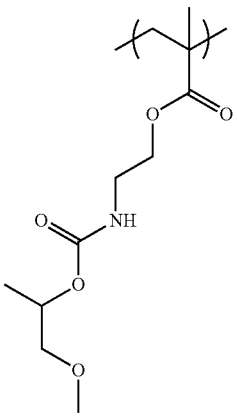
(1-19)
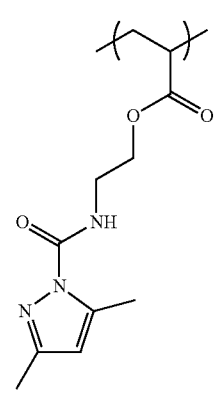
(1-20)
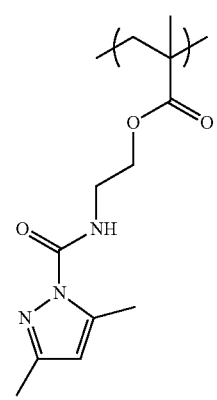
Examples of the structural unit of Formula (2) include structural units of the following Formulae (2-1) to (2-16). As $R^3$ of the structural unit of the Formula (2), an organic group having a skeleton (cyclic structure) that is introduced into a polymer in a resist solution is selected.
(2-1)

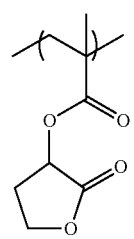 (2-2)
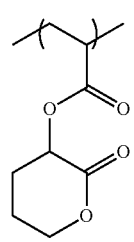 (2-3)
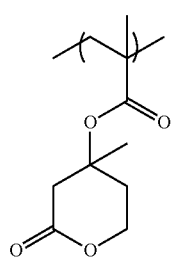 (2-4)
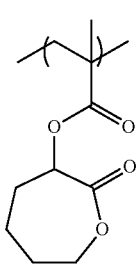 (2-5)
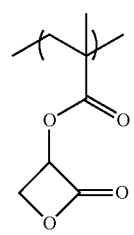 (2-6)
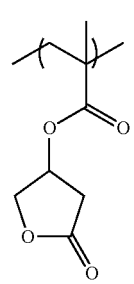 (2-7)
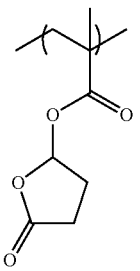 (2-8)
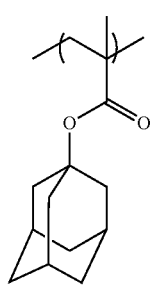 (2-9)
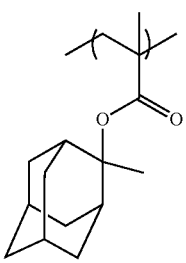 (2-10)
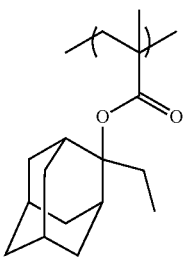 (2-11)
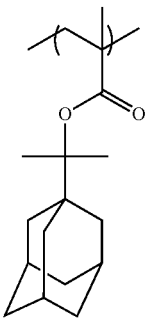 (2-12)
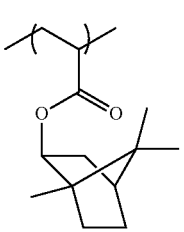 (2-13)

(2-14)

(2-15)

(2-16)

Examples of the structural unit of Formula (3) include structural units of the following Formulae (3-1) to (3-6). The structural unit of Formula (3) is a moiety of transferring the copolymer having the structural unit to a surface of a resist underlayer film.

(3-1)

(3-2)

(3-3)

(3-4)

(3-5)

(3-6)

Examples of the structural unit of Formula (4) include structural units of the following Formulae (4-1) to (4-4). In the following Formulae (4-1) to (4-4), only an example in which $R^6$ in the structural unit of Formula (4) is a hydrogen atom or a methyl group is shown. However, when $R^6$ is a halogeno group, $R^6$ is selected from the group consisting of a fluoro group, a chloro group, a bromo group, and an iodo group. The structural unit of Formula (4) is a photoacid generating moiety.

(4-1)

(4-2)
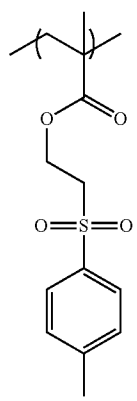
(4-3)
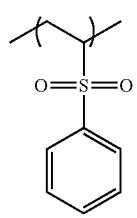
(4-4)
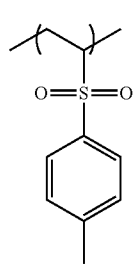
Examples of a monomer forming the structural unit of Formula (5) include 2-hydroxypropyl (meth)acrylate, 2-hydroxy-3-phenoxypropyl (meth)acrylate, 2-hydroxy-3-chloropropyl (meth)acrylate, N-(2-hydroxypropyl) (meth)acrylamide, and 3-(perfluorobutyl)-2-hydroxypropyl (meth)acrylate. Examples of the structural unit of Formula (5) include structural units of the following Formulae (5-1) to (5-10)
(5-1)
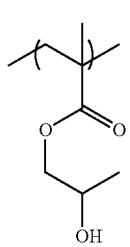
(5-2)
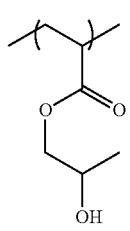
(5-3)
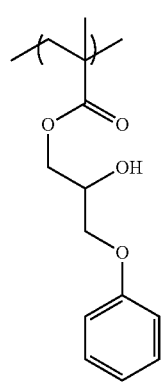
(5-4)
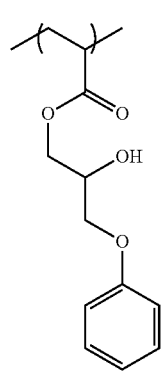
(5-5)
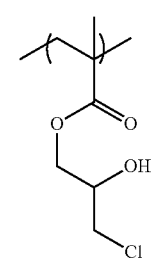
(5-6)
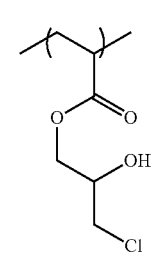
(5-7)
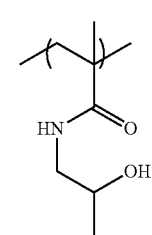

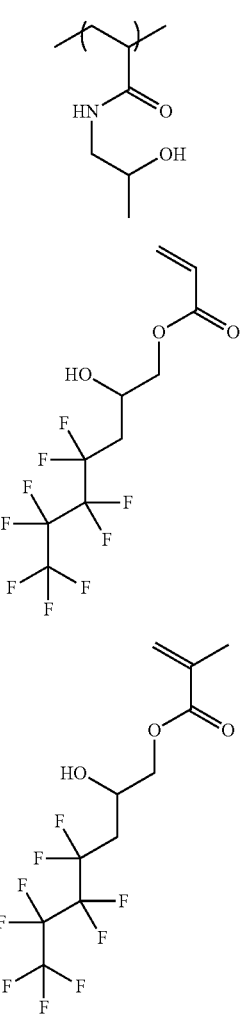

(5-8)

(5-9)

(5-10)

[Resin]

The resist under layer film-forming composition for lithography according to the second aspect of the present invention contains a resin having structural units of Formulae (6) and (7) that is different from the copolymer described above. The resin may further have a structure of the following Formula (8) at a terminal of a polymeric chain.

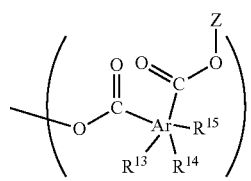

(8)

(wherein $R^1$, $R^{14}$, and $R^{15}$ are each independently a hydrogen atom, a linear or branched alkyl group having a carbon atom number of 1 to 13, a halogeno group, or a hydroxy group, at least one of $R^{13}$, $R^{14}$, and $R^{15}$ is the alkyl group, Ar is an aromatic hydrocarbon ring or an alicyclic hydrocarbon ring, two carbonyl groups are each bonded to two carbon atoms adjacent to the ring of Ar, and Z is a linear or branched alkyl group having a carbon atom number of 1 to 6 that optionally has a $C_{1-3}$ alkoxy group as a substituent.)

The resin is not particularly limited as long as it is a polymer used for the resist underlayer film-forming composition. Examples of the resin include a polymer having two kinds of structural units of the following Formulae and a polymer having two kinds of structural units and a terminal structure of the following Formulae.

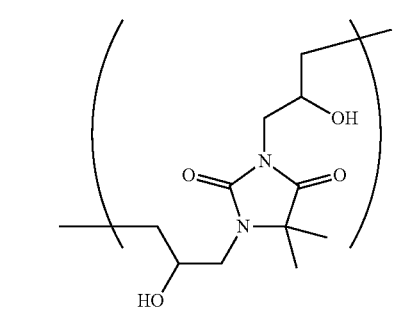

(6-4)
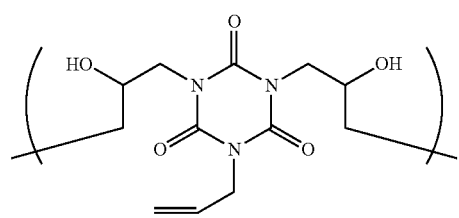
(7-4)
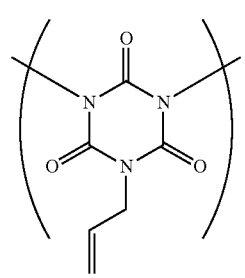
(6-5)
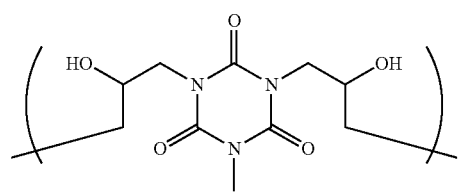
(7-5)
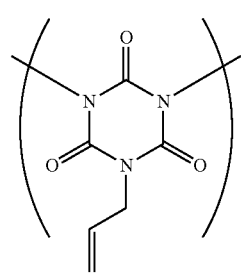
(6-6)
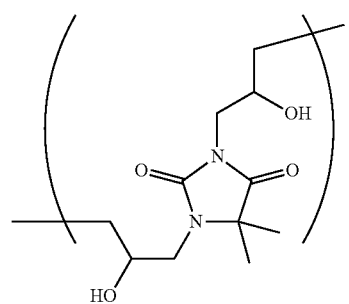
(7-6)
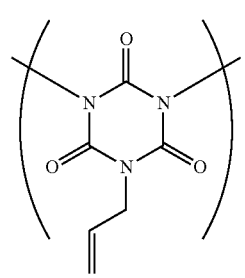
(6-7)
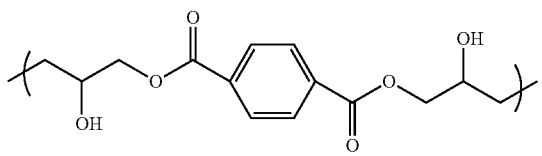
(7-7)
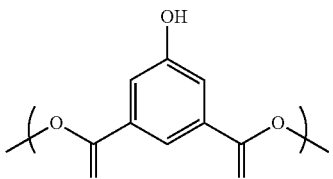
(8-7)
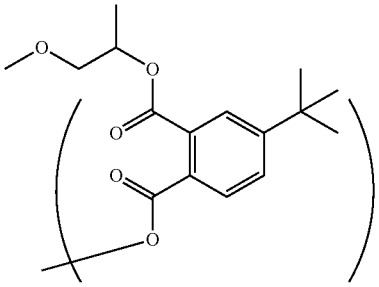
(6-8)
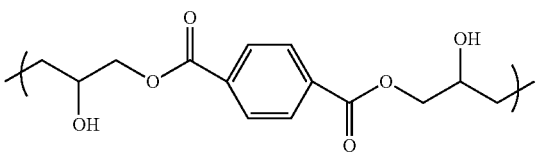
(7-8)
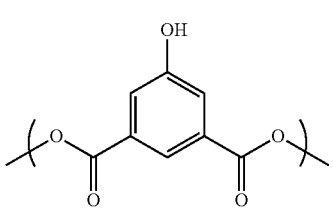
(8-8)
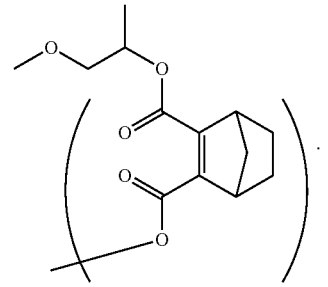
(6-9)
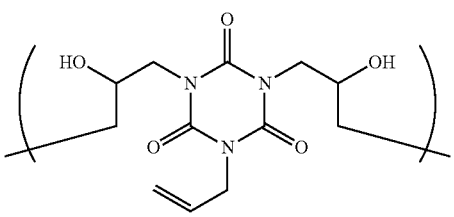

-continued
(7-9)
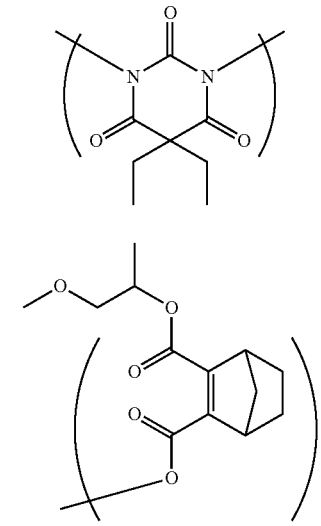
(8-9)
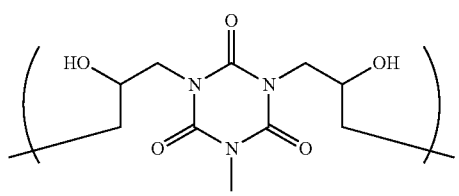
(6-10)
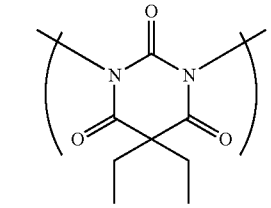
(7-10)
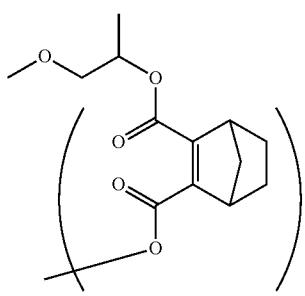
(8-10)
(6-11)
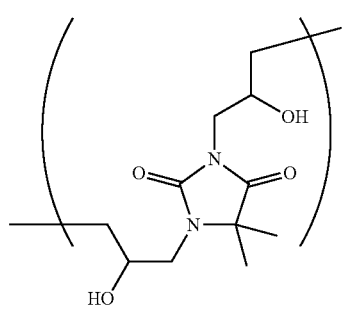
-continued
(7-11)
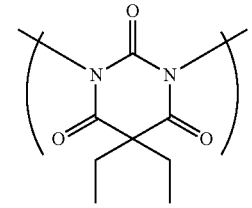
(8-11)
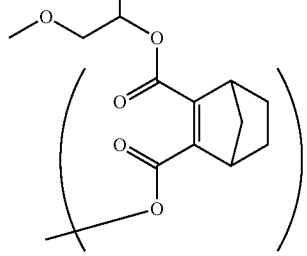
(6-12)
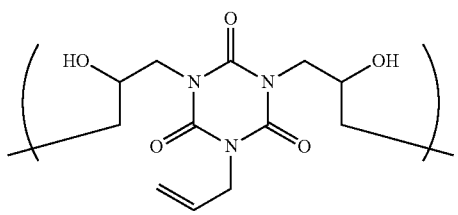
(7-12)
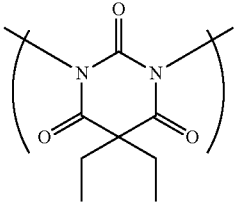
(8-12)
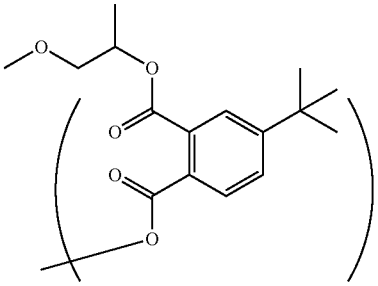
(6-13)
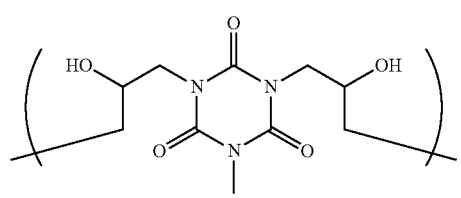

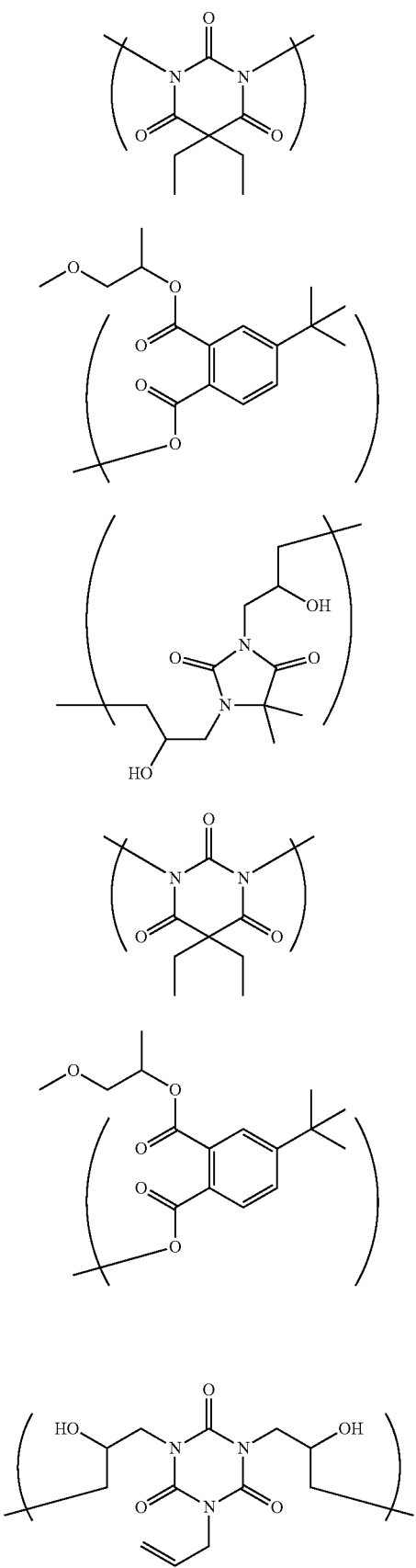
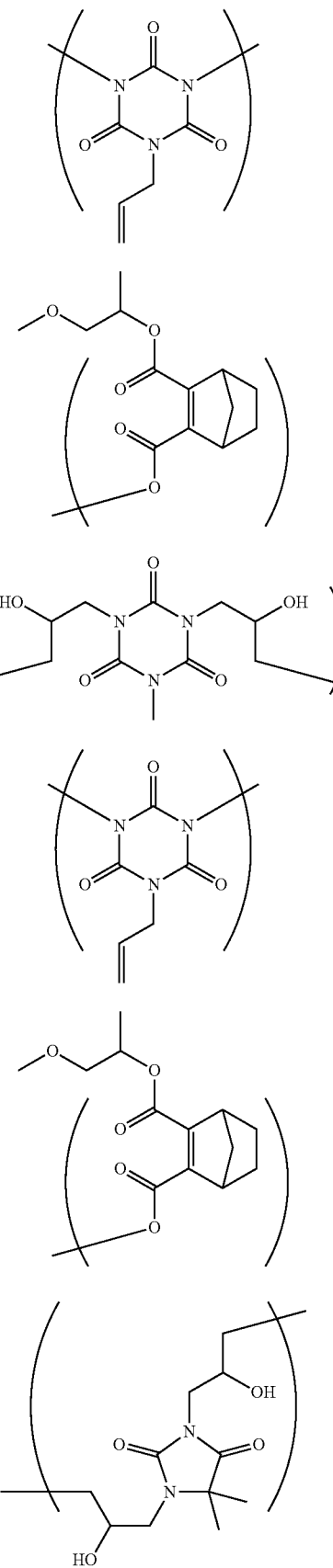

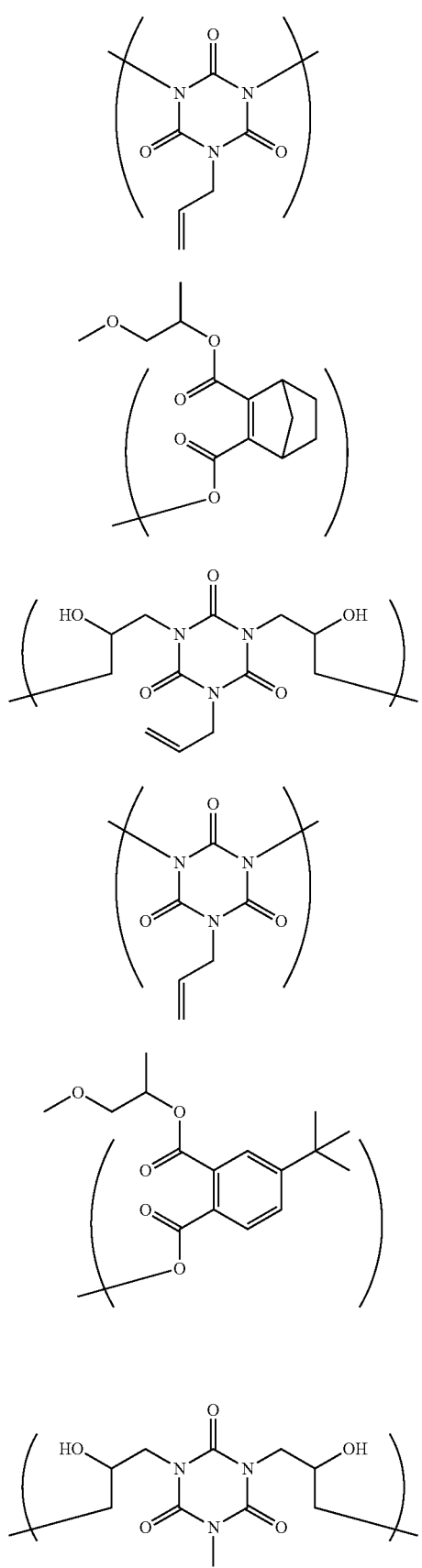

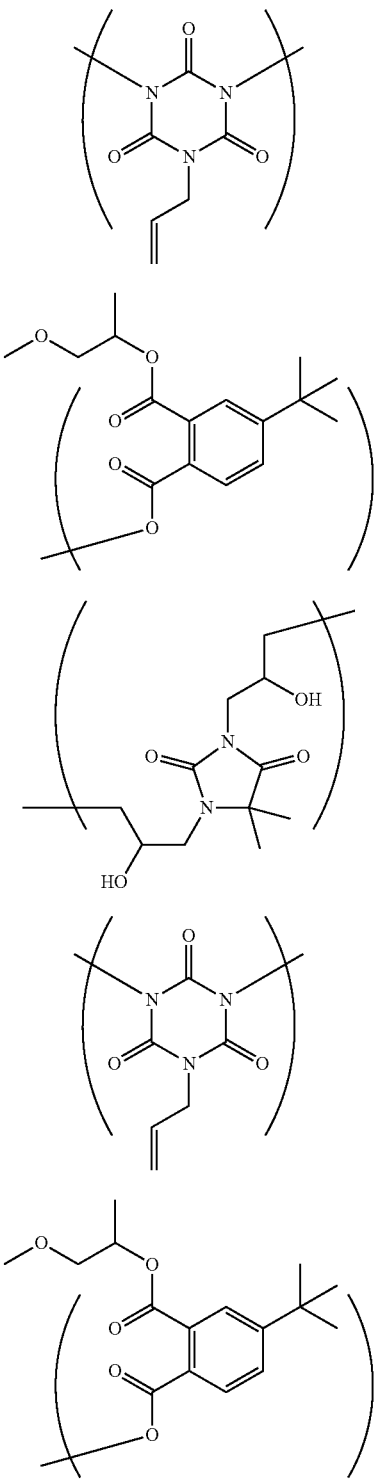

[Crosslinker]

The resist underlayer film-forming composition further contains a crosslinker. Examples of the crosslinker include hexamethoxymethylmelamine, tetramethoxymethyl benzoguanamine, 1,3,4,6-tetrakis(methoxymethyl) glycoluril (POWDERLINK (registered trademark) 1174), 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea. The content of the crosslinker relative to the resin is, for example, 1% by mass to 30% by mass.

[Organic Acid]

The resist underlayer film-forming composition further contains an organic acid. The organic acid is a catalyst component for promoting a cross-linking reaction. Examples thereof include sulfonic acid compounds and carboxylic acid compounds such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-phenolsulfonic acid, methyl 4-phenolsulfonate, benzenedisulfonic acid, 1-naphthalenesulfonic acid, citric acid, benzoic acid, and hydroxybenzoic acid. These organic acids may be contained singly or in combination of two or more in the resist underlayer film-forming composition. The content of the organic acid relative to the crosslinker is, for example, 0.1% by mass to 20% by mass.

[Solvent]

The resist underlayer film-forming composition further contains a solvent. Examples of the solvent include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more selected from the solvents. The content of the solvent relative to the resist underlayer film-forming composition is, for example, 50% by mass to 99.5% by mass. The additive for a resist underlayer film-forming composition may contain the solvent. In this case, the content of the solvent relative to the additive for a resist underlayer film-forming composition is, for example, 50% by mass to 95% by mass.

[Other Additives]

The resist underlayer film-forming composition may further contain a surfactant, if necessary. The surfactant is an additive for enhancing the application property of the resist underlayer film-forming composition to a substrate. A publicly known surfactant such as a nonionic surfactant and a fluorosurfactant can be used. Specific examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylarylethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants including Eftop (registered trademark) EF301, EF303, and EF352 (available from Mitsubishi Materials Electronic Chemicals Co., Ltd.), MEGAFACE (registered trademark) F171, F173, R-30, R-40, and R-40-LM (available from DIC Corporation), Fluorad FC430 and FC431 (available from Sumitomo 3M, Ltd.), AsahiGuard (registered trademark) AG710, and Surflon (registered trademark) S-382, SC101, SC102, SC103, SC104, SC105, and SC106 (available from Asahi Glass Co., Ltd.); and organosiloxane polymer KP341 (available from Shin-Etsu Chemical Co., Ltd.). These surfactants may be contained singly or in combination of two or more in the resist underlayer film-forming composition. When the resist underlayer film-forming composition contains the surfactant, the content of the surfactant relative to the resin is, for example, 0.1% by mass to 5% by mass, and preferably 0.2% by mass to 3% by mass.

Hereinafter, the method for forming a resist pattern of the present invention will be described. The resist underlayer film-forming composition for lithography of the present invention is first applied to a substrate used in production of a precision integrated circuit element (e.g., a semiconductor substrate such as a silicon wafer coated with a silicon oxide film, a silicon nitride film, or a silicon nitride oxide film, a silicon nitride substrate, a quartz substrate, a glass substrate (including alkali-free glass, low alkaline glass, and crystalline glass), and a glass substrate having an ITO film) by an appropriate applying procedure using a spinner, a coater, or the like, and then baked by a heating means such as a hot plate and cured to form a resist underlayer film.

For example, a baking condition after the application is appropriately selected from a baking temperature of 80° C. to 250° C. and a baking time of 0.3 minutes to 60 minutes. It is preferable that the baking temperature be 150° C. to 250° C. and the baking time be 0.5 minutes to 5 minutes. When the resist underlayer film-forming composition is baked under such conditions, a cross-linking moiety such as a hydroxy group in the structural unit of the polymer is reacted with the crosslinker to form a cross-linking structure. In particular, when the polymer contained in the resist underlayer film-forming composition for lithography of the present invention is cross-linked, the cross-link density of the cross-linking polymer can be increased. For example, the resist underlayer film has a thickness of 0.001 μm (1 nm) to 0.025 μm (25 nm), and preferably 0.003 μm (3 nm) to 0.01 μm (10 nm).

Subsequently, a resist film is formed on the formed resist underlayer film. The resist film can be formed by a general method, that is, by applying a resist solution to the resist underlayer film, followed by baking. As the resist solution to be applied, for example, either negative or positive resist solution may be used without particular limitation as long as it can be sensitive to a KrF excimer laser, an ArF excimer laser, EUV, or an electron beam. Examples of usable resist solution include trade name PAR710 and PAR855 available from Sumitomo Chemical Co., Ltd., trade name AR2772JN available from JSR Corporation, trade name SEPR430 available from Shin-Etsu Chemical Co., Ltd., and trade name APEX-X available from Dow Chemical Company (Rohm and Haas Electronic Materials LLC).

Subsequently, the resist film formed on the resist underlayer film is exposed to light through a predetermined mask (reticle). For example, a KrF excimer laser, an ArF excimer laser, or EUV can be used for exposure. In a case of exposure by an electron beam, a mask (reticle) is not required. After the exposure, post exposure bake (PEB) can be also carried out, if necessary. A condition of post exposure bake is appropriately selected from a heating temperature of 80° C. to 150° C. and a heating time of 0.3 minutes to 60 minutes.

After the exposure, development, rinsing, and drying are carried out to obtain a favorable resist pattern. As a developer for the resist film, an alkaline aqueous solution or an organic solvent can be used. Examples of the alkaline aqueous solution include: aqueous solutions of inorganic alkalis including sodium hydroxide, potassium hydroxide, sodium carbonate, sodium silicate, sodium metasilicate, and aqueous ammonia; aqueous solutions of primary amines such as ethylamine and n-propylamine; aqueous solutions of secondary amines such as diethylamine and di-n-butylamine; aqueous solutions of tertiary amines such as triethylamine and methyldiethylamine; aqueous solutions of alcoholamines such as dimethylethanolamine and triethanolamine; aqueous solutions of quaternary ammonium salts such as tetramethylammonium hydroxide, tetraethylammonium hydroxide, and choline; and aqueous solutions of cyclic amines such as pyrrole and piperidine. A developer in which proper amounts of an alcohol such as isopropyl alcohol and a surfactant such as a nonionic surfactant are added to the aqueous solution of the alkali can be used. Among the developers, an aqueous solution of quaternary ammonium salt is preferable, and an aqueous solution of tetramethylammonium hydroxide is further preferable. Examples of the organic solvent used as the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl-3-ethoxypropionate, and propyl-3-methoxypropionate. Among these, butyl acetate is preferable. A development condition is appropriately selected from a development temperature of 5° C. to 50° C. and a development time of 10 seconds to 300 seconds.

The resist underlayer film at an exposed area where the resist film is developed and removed in the process described above can be removed by dry etching, to form a desired pattern on the substrate.

EXAMPLES

Weight average molecular weights shown in the following Synthesis Examples 1 and 3 herein are results measured by gel permeation chromatography (hereinafter abbreviated as GPC in the specification). In the measurement, a GPC device manufactured by TOSOH CORPORATION was used. A degree of distribution shown in the following Synthesis Examples herein is calculated from the measured weight average molecular weight and a number average molecular weight.

Synthesis Example 1

100.00 g of diglycidyl terephthalate (trade name: Denacol (registered trademark) EX-711, available from Nagase ChemteX Corporation), 63.32 g of 5-hydroxyisophthalic acid (available from Tokyo Chemical Industry Co., Ltd.), 15.97 g of 4-tert-butylphthalic anhydride (available from Tokyo Chemical Industry Co., Ltd.), and 3.96 g of benzyltriethylammonium chloride (available from Tokyo Chemical Industry Co., Ltd.) were added and dissolved in 733.01 g of propylene glycol monomethyl ether in a reactor. The atmosphere of the reactor was replaced with nitrogen, and a reaction was caused at 135° C. for 4 hours to obtain a solution containing a polymer. The solution containing the polymer was not clouded even under cooling to room temperature. The solution containing the polymer has good solubility in propylene glycol monomethyl ether. The obtained solution containing the polymer was subjected to GPC analysis. The weight average molecular weight of the polymer in the solution in terms of standard polystyrene was 4,095. The degree of dispersion was 1.36. The polymer obtained in this Synthesis Example corresponds to a resin that has structural units of the following Formulae (6-7) and (7-7), and a structure of the following Formula (8-7) at a terminal of a polymer chain, and is contained in the resist underlayer film-forming composition of the present invention.

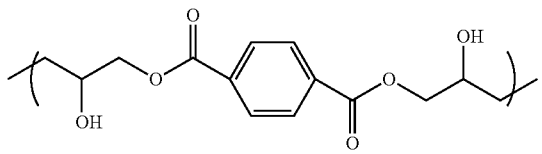

(6-7)

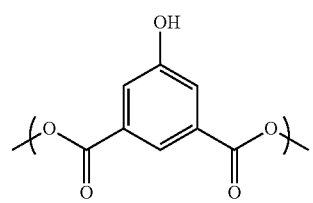

(7-7)

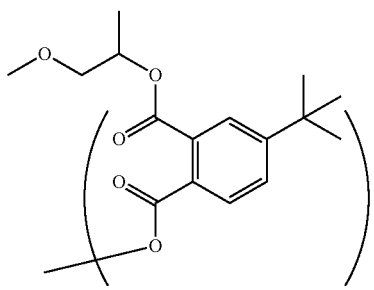

(8-7)

Synthesis Example 2

To 10.00 g of 2-(O-[1'-methylpropylideneamino]carboxyamino)ethyl methacrylate (trade name: Karenz (registered trademark) MOI-BM, available from Showa Denko K.K.), 3.57 g of hydroxypropyl methacrylate (available from Tokyo Chemical Industry Co., Ltd.), and 2.78 g of trifluoroethyl methacrylate (available from Osaka Organic Chemical Industry Ltd.). 38.23 g of propylene glycol monomethyl ether was added in a flask. The atmosphere in the flask was replaced with nitrogen, and the temperature was increased to 70° C. To the flask, 0.68 g of azobisisobutyronitrile (AIBN) dissolved in 33.89 g of propylene glycol monomethyl ether was added as a polymerization initiator under nitrogen pressure. A reaction was caused for 24 hours, to obtain a solution containing a copolymer having structural units of the following Formulae (1-2), (5-1), and (3-2). The obtained solution containing the copolymer was subjected to GPC analysis. The weight average molecular weight of the copolymer in the solution in terms of standard polystyrene was 9,465. The degree of dispersion was 2.37. The copolymer obtained in this Synthesis Example corresponds to a copolymer used for the additive for a resist underlayer film-forming composition of the present invention.

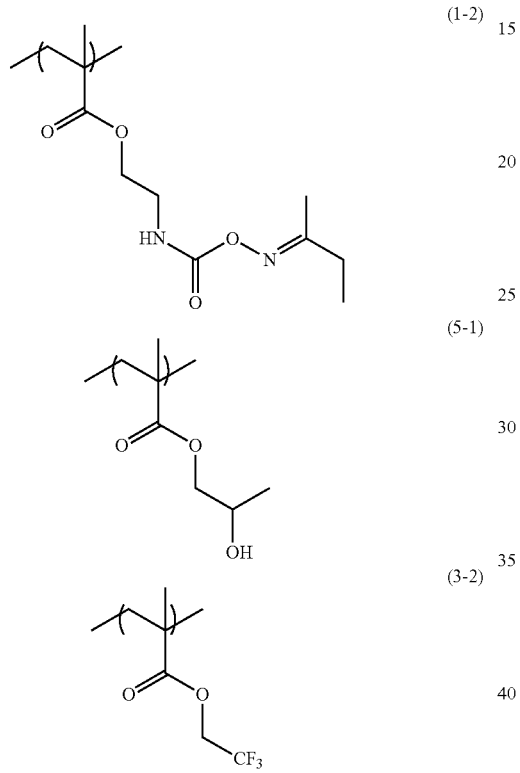

Synthesis Example 3

To 6.82 g of 2-(O-[1'-methylpropylideneamino]carboxyamino)ethyl methacrylate (trade name: Karenz (registered trademark) MOI-BM, available from Showa Denko K.K.), 4.43 g of 1,1,1,3,3,3-hexafluoroisopropyl methacrylate (available from Tokyo Chemical industry Co., Ltd.), 6.20 g of adamantyl methacrylate (available from Osaka Organic Chemical Industry Ltd.), and 5.03 g of 2-tosylethyl methacrylate obtained in Synthesis Example 3 in Patent Document 5, 23.73 g of propylene glycol monomethyl ether was added in a flask. The atmosphere in the flask was replaced with nitrogen, and the temperature was increased to 70° C. To the flask, 0.77 g of azobisisobutyronitrile (AIBN) dissolved in 38.51 g of propylene glycol monomethyl ether was added as a polymerization initiator under nitrogen pressure. A reaction was caused for 24 hours, to obtain a solution containing a copolymer having structural units of the following Formulae (1-2), (2-9), (3-4), and (4-2). The obtained solution containing the copolymer was subjected to GPC analysis. The weight average molecular weight of the copolymer in the solution in terms of standard polystyrene was 10,012. The degree of dispersion was 2.52. The copolymer obtained in this Synthesis Example corresponds to a copolymer used for the additive for a resist underlayer film-forming composition of the present invention.

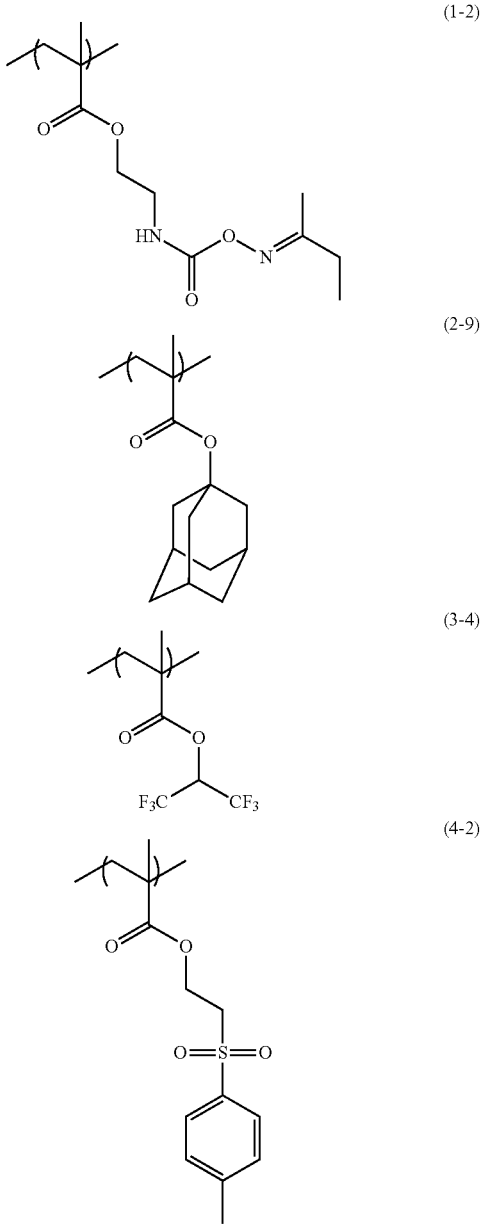

Example 1

In 0.87 g of the solution containing 0.14 g of the polymer obtained in Synthesis Example 1 herein, 0.12 g of the solution containing 0.0021 g of the copolymer obtained in Synthesis Example 2, 0.035 g of tetramethoxymethyl glycoluril (trade name: POWDERLINK (registered trademark) 1174, available from Nihon Cytec Industries Inc.), and 0.0043 g of pyridinium p-toluenesulfonate (available from Tokyo Chemical Industry Co., Ltd.) were mixed in the mixture, 5.04 g of propylene glycol monomethyl ether and 13.86 g of propylene glycol monomethyl ether acetate were added and dissolved. Subsequently, the solution was filtered through a microfilter made of polyethylene with a pore diameter of 0.05 μm to obtain a resist underlayer film-forming composition for lithography.

Example 2

In 0.87 g of the solution containing 0.14 g of the polymer obtained in Synthesis Example 1, 0.12 g of the solution containing 0.021 g of the copolymer obtained in Synthesis Example 3, 0.035 g of tetramethoxymethyl glycoluril (trade name: POWDERLINK (registered trademark) 1174, available from Nihon Cytec Industries Inc.), and 0.0044 g of pyridinium p-toluenesulfonate (available from Tokyo Chemical Industry Co., Ltd.) were mixed. In the mixture, 5.09 g of propylene glycol monomethyl ether and 13.86 g of propylene glycol monomethyl ether acetate were added and dissolved. Subsequently, the solution was filtered through a microfilter made of polyethylene with a pore diameter of 0.05 μm to obtain a resist underlayer film-forming composition for lithography.

Example 3

In 1.17 g of solution containing 0.21 g of polymer having structural units of the following Formulae (6-1) and (7-1), obtained in Synthesis Example 1 described in WO2005/098542, 0.19 g of the solution containing 0.031 g of the copolymer obtained in Synthesis Example 2, 0.52 g of tetramethoxymethyl glycoluril (trade name: POWDER-LINK (registered trademark) 1174, available from Nihon Cytec Industries Inc.), and 0.0066 g of p-toluenesulfonic acid (available from Tokyo Chemical Industry Co., Ltd.) were mixed. In the mixture, 12.68 g of propylene glycol monomethyl ether and 5.91 g of propylene glycol monomethyl ether acetate were added and dissolved. Subsequently, the solution was filtered through a microfilter made of polyethylene with a pore diameter of 0.05 μm to obtain a resist underlayer film-forming composition for lithography.

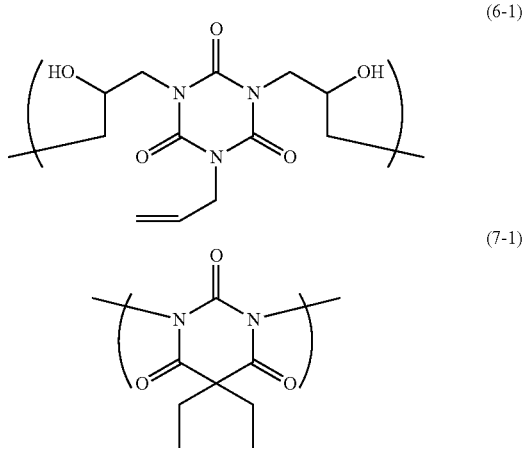

Example 4

In 1.17 g of solution containing 0.21 g of polymer having structural units of Formulae (6-1) and (7-1), obtained in Synthesis Example 1 described in WO2005/098542, 0.18 g of the solution containing 0.031 g of the copolymer obtained in Synthesis Example 2, 0.052 g of tetramethoxymethyl glycoluril (trade name: POWDERLINK (registered trademark) 1174, available from Nihon Cytec Industries Inc.), and 0.0066 g of p-toluenesulfonic acid (available from Tokyo Chemical Industry Co., Ltd.) were mixed. In the mixture, 12.68 g of propylene glycol monomethyl ether and 5.91 g of propylene glycol monomethyl ether acetate were added and dissolved. Subsequently, the solution was filtered through a microfilter made of polyethylene with a pore diameter of 0.05 μm to obtain a resist underlayer film-forming composition for lithography.

Comparative Example 1

In 0.97 g of the solution containing 0.16 g of the polymer obtained in Synthesis Example 1 herein, 0.039 g of tetramethoxymethyl glycoluril (trade name: POWDERLINK (registered trademark) 1174, available from Nihon Cytec Industries Inc.), and 0.0049 g of pyridinium p-toluenesulfonate (available from Tokyo Chemical Industry Co., Ltd.) were mixed. In the mixture, 5.12 g of propylene glycol monomethyl ether and 13.86 g of propylene glycol monomethyl ether acetate were added and dissolved. Subsequently, the solution was filtered through a microfilter made of polyethylene with a pore diameter of 0.05 μm to obtain a resist underlayer film-forming composition for lithography. The resist underlayer film-forming composition prepared in Comparative Example 1 did not contain the additive for a resist underlayer film-forming composition of the present invention.

Comparative Example 2

In 0.87 g of solution containing 0.16 g of polymer having structural units of Formulae (6-1) and (7-1), obtained in Synthesis Example 1 described in WO2005/098542, 0.039 g of tetramethoxymethyl glycoluril (trade name: POWDER-LINK (registered trademark) 1174, available from Nihon Cytec Industries Inc.), and 0.049 g of p-toluenesulfonic acid (available from Tokyo Chemical Industry Co., Ltd.) were mixed. In the mixture, 13.15 g of propylene glycol monomethyl ether and 5.94 g of propylene glycol monomethyl ether acetate were added and dissolved. Subsequently, the solution was filtered through a microfilter made of polyethylene with a pore diameter of 0.05 μm to obtain a resist underlayer film-forming composition for lithography. The resist underlayer film-forming composition prepared in Comparative Example 2 did not contain the additive for a resist underlayer film-forming composition of the present invention.

(Elution Test into Photoresist Solvent)

Each resist underlayer film-forming composition for lithography prepared in Examples 1 to 4 and Comparative Examples 1 and 2 was applied to a silicon wafer as a semiconductor substrate by using a spinner. Each silicon wafer was placed on a hot plate, and baked at 205° C. for 1 minute to form a resist underlayer film having a thickness of 25 nm. Each resist underlayer film was immersed in a solvent including 70% by mass of propylene glycol monomethyl ether and 30% by mass of propylene glycol monomethyl ether acetate. An experiment for confirming whether the resist underlayer film-forming composition is insoluble in the solution was carried out. As a result, there was no difference in film thickness between before and after the immersion.

(Formation of Photoresist Pattern and Adhesion Test of Resist Pattern)

Each resist underlayer film-forming composition for lithography prepared in Examples 1 to 4 and Comparative Examples 1 and 2 was applied to a silicon wafer with a vapor deposited SiON film by using a spinner. Each silicon wafer was placed on a hot plate, and baked at 205° C. for 1 minute to form a resist underlayer film having a thickness of 5 nm. A commercially available photoresist solution (trade name: PAR855 available from Sumitomo Chemical Co., Ltd.) was applied to the resist underlayer film by using a spinner, and heated on a hot plate at 105° C. for 60 seconds, to form a photoresist film (thickness: 0.10 μm).

Subsequently, the photoresist film was exposed to light at an optimum exposure dose through a photomask by using a scanner NSR-S307E manufactured by Nikon Corporation (wavelength: 193 inn, NA: 0.85, a: 0.65/0.93 (Dipole). The photomnask was selected depending on a resist pattern to be formed. After the exposure, post exposure bake (PEB) was carried out at 105° C. for 60 seconds on a hot plate. After cooling, the photoresist film was developed using a 0.26 N tetramethylammonium hydroxide aqueous solution as a developer by a 60-second single puddle process in accordance with industrial standard. By the processes described above, a resist pattern was formed. Whether a line and space pattern (hereinafter abbreviated as L/S) is formed is shown in Tables 1 and 2. A case where a L/S is formed is evaluated to be "good."

The exposure dose is increased step-wise from the optimum exposure dose, to increase the exposure dose of a space portion of L/S. As a result, the line width of L/S formed is gradually decreased. At that time, the line width of a line pattern at a stage before occurrence of collapse of the line pattern is defined as minimal dimension before collapse, and is used as an indication of adhesion to a resist pattern. The results are shown in Tables 1 and 2. A smaller value of minimal dimension before collapse suggests higher adhesion of a resist underlayer film to a resist pattern. In particular, in a case where the line width of a resist pattern is fine, a difference of 1 nm is important. Therefore, it is very preferable that the minimal dimension before collapse be as small as possible on the order of nanometers.

TABLE 1

|  | Minimal Dimension Before Collapse (nm) | Formation of L/S |
|---|---|---|
| Example 1 | 31 nm | Good |
| Example 2 | 31 nm | Good |
| Comparative Example 1 | 33 nm | Good |

TABLE 2

|  | Minimal Dimension Before Collapse (nm) | Formation of L/S |
|---|---|---|
| Example 3 | 32 nm | Good |
| Example 4 | 30 nm | Good |
| Comparative Example 2 | 33 nm | Good |

The invention claimed is:

1. An additive for a resist underlayer film-forming composition, comprising a copolymer having structural units of the following Formulae (1) to (3):

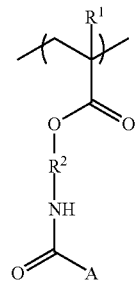

(1)

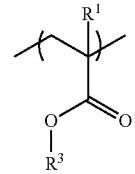

(2)

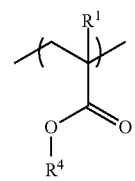

(3)

wherein $R^1$s are each independently a hydrogen atom or a methyl group, $R^2$ is a $C_{1-3}$ alkylene group, A is a protecting group, $R^3$ is an organic group having 4 to 7-membered ring lactone skeleton, adamantane skeleton, tricyclodecane skeleton, or norbornane skeleton, and $R^4$ is a linear, branched, or cyclic organic group having a carbon atom number of 1 to 12, in which at least one hydrogen atom is substituted with a fluoro group and that optionally has at least one hydroxy group as a substituent, and wherein the copolymer further has a structural unit of the following Formula (4):

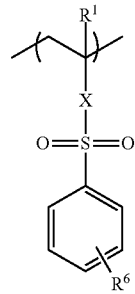

(4)

wherein $R^1$ has the same definition as $R^1$ in Formulae (1) to (3), X is a direct bond or a —C(=O)O—$R^5$— group, $R^5$ constituting the —C(=O)O—$R^5$— group is a $C_{1-3}$ alkylene group, which is bonded to a sulfur atom, and $R^6$ is a hydrogen atom, a methyl group, a methoxy group, or a halogeno group.

2. The additive for a resist underlayer film-forming composition according to claim 1, wherein the structural unit of Formula (4) is a structural unit of the following Formula (4a) or (4b):

(4a)

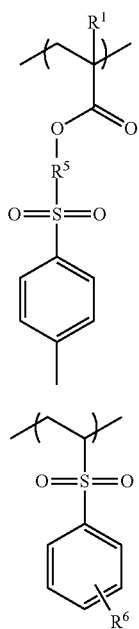

(4b)

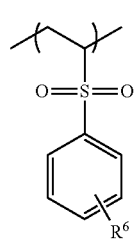

wherein $R^1$, $R^5$, and $R^6$ have the same definitions as $R^1$, $R^5$, and $R^6$ in Formula (4) according to claim 1.

3. The additive for a resist underlayer film-forming composition according to claim 1, wherein the structural unit of Formula (1) is a structural unit of the following Formula (1a), (1b), (1c), or (1d):

(1a)

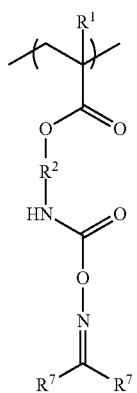

(1b)

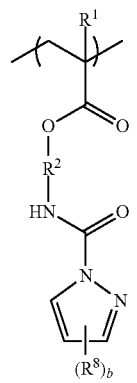

(1c)

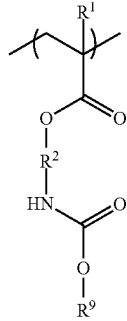

(1d)

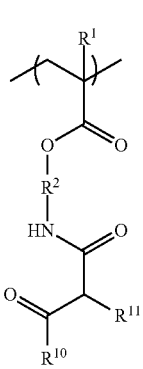

wherein $R^1$ and $R^2$ have the same definitions as $R^1$ and $R^2$ in Formula (1) according to claim 1, each of two $R^7$s is independently a hydrogen atom, a methyl group, or ethyl group, $R^8$ is a methyl group, b is an integer of 0 to 3, $R^9$ is a linear or branched alkyl group having a carbon atom number of 1 to 6, or a linear or branched alkoxyalkyl group having a carbon atom number of 1 to 6, $R^{10}$ is a linear or branched alkoxy group having a carbon atom number of 1 to 6, and $R^{11}$ is a hydrogen atom, or a linear or branched alkoxycarbonyl group having a carbon atom number of 2 to 6.

4. The additive for a resist underlayer film-forming composition according to claim 1, wherein the copolymer has a weight average molecular weight of 1,500 to 20,000.

5. An additive for a resist underlayer film-forming composition, comprising a copolymer having structural units of the following Formulae (1), (3) and (5):

(1)

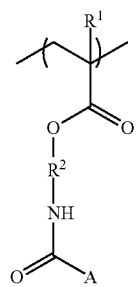

-continued (3)

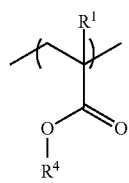

(5)

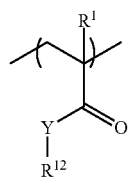

wherein $R^1$s are each independently a hydrogen atom or a methyl group, $R^2$ is a $C_{1-3}$ alkylene group, A is a protecting group, $R^4$ is a linear, branched, or cyclic organic group having a carbon atom number of 1 to 12, in which at least one hydrogen atom is substituted with a fluoro group and that optionally has at least one hydroxy group as a substituent, Y is an —O— group or an —NH— group, and $R^{12}$ is a linear or branched hydroxyalkyl group having a carbon atom number of 1 to 12, in which at least one hydrogen atom is optionally substituted with a fluoro group or a chloro group and that optionally has a phenoxy group as a substituent.

6. A resist underlayer film-forming composition for lithography comprising
an additive for a resist underlayer film-forming composition comprising a copolymer having structural units of the following Formulae (1) to (3):

(6)

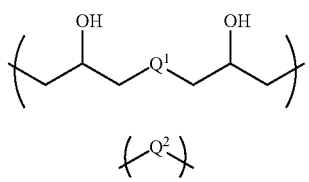

(7)

wherein $R^1$s are each independently a hydrogen atom or a methyl group, $R^2$ is a $C_{1-3}$ alkylene group, A is a protecting group, $R^3$ is an organic group having 4 to 7-membered ring lactone skeleton, adamantane skeleton, tricyclodecane skeleton, or norbornane skeleton, and $R^4$ is a linear, branched, or cyclic organic group having a carbon atom number of 1 to 12, in which at least one hydrogen atom is substituted with a fluoro group and that optionally has at least one hydroxy group as a substituent,
a resin having structural units of the following Formulae (6) and (7) that is different from the copolymer used for the additive, (6)

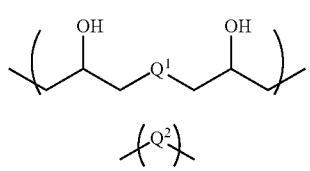

(7)

wherein $Q^1$ and $Q^2$ are each independently a divalent organic group having a linear or branched hydrocarbon group having a carbon atom number of 1 to 13, a divalent organic group having an alicyclic hydrocarbon ring, a divalent organic group having an aromatic hydrocarbon ring, or a divalent organic group having a heterocyclic ring containing 1 to 3 nitrogen atoms, and the hydrocarbon group, the alicyclic hydrocarbon ring, the aromatic hydrocarbon ring, and the heterocyclic ring optionally have at least one substituent,
an organic acid,
a crosslinker, and
a solvent,
wherein a content of the copolymer used for the additive is 3 parts by mass to 40 parts by mass relative to 100 parts by mass of the resin.

7. A method for forming a resist pattern comprising the steps of:
applying the resist underlayer film-forming composition for lithography according to claim 6 to a substrate, followed by baking, to form a resist underlayer film having a thickness of 1 nm to 25 nm;
applying a resist solution to the resist underlayer film, followed by heating, to form a resist film;
exposing the resist film with a photomask to radiation selected from the group consisting of a KrF excimer laser, an ArF excimer laser, and extreme ultraviolet light; and
developing the exposed resist film by using a developer.

* * * * *